(12) United States Patent
Zhou et al.

(10) Patent No.: US 8,148,805 B2
(45) Date of Patent: *Apr. 3, 2012

(54) FORMING COMPLIANT CONTACT PADS FOR SEMICONDUCTOR PACKAGES

(75) Inventors: Qing Zhou, Chandler, AZ (US); Wei Shi, Gilbert, AZ (US); Daoqiang Lu, Chandler, AZ (US); Jiangqi He, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/075,345

(22) Filed: Mar. 30, 2011

(65) Prior Publication Data

US 2011/0175230 A1 Jul. 21, 2011

Related U.S. Application Data

(62) Division of application No. 12/426,322, filed on Apr. 20, 2009, now Pat. No. 7,939,922, which is a division of application No. 11/301,174, filed on Dec. 12, 2005, now Pat. No. 7,538,019.

(51) Int. Cl.
*H01L 23/02* (2006.01)
*H01L 21/44* (2006.01)
*H01L 21/31* (2006.01)

(52) U.S. Cl. . 257/678; 257/684; 257/707; 257/E21.259; 257/E23.02; 438/107; 438/612; 438/614; 438/780

(58) Field of Classification Search .................. 438/107, 438/612, 614, 619, 780; 257/678, 684, 707, 257/729, E21.259, E23.02
See application file for complete search history.

(56) References Cited

U.S. PATENT DOCUMENTS 6,941,537 B2 * 9/2005 Jessep et al. .................. 716/137
7,939,922 B2 * 5/2011 Zhou et al. .................... 257/678

* cited by examiner

*Primary Examiner* — Hsien Ming Lee
(74) *Attorney, Agent, or Firm* — Trop, Pruner & Hu, P.C.

(57) ABSTRACT

In one embodiment, the present invention includes a semiconductor package having a substrate with a first surface to support a semiconductor die. A second surface of the substrate includes compliant conductive pads to provide electrical connections to the semiconductor die. In this way, improved connection between the semiconductor package and a socket is provided. Other embodiments are described and claimed.

10 Claims, 6 Drawing Sheets

FORMING COMPLIANT CONTACT PADS FOR SEMICONDUCTOR PACKAGES

CROSS-REFERENCE TO RELATED APPLICATIONS

This application is a divisional of U.S. patent application Ser. No. 12/426,322, filed on Apr. 20, 2009, now U.S. Pat. No. 7,939,922, which is a divisional of U.S. patent application Ser. No. 11/301,174, filed on Dec. 12, 2005, which issued as U.S. Pat. No. 7,538,019.

BACKGROUND

Embodiments of the present invention relate to integrated circuit (IC) packaging technology and more particularly to improving connections between a substrate and a socket or other device.

Today's ICs are manufactured with increasingly higher performance, reduced costs, and increased miniaturization of components and devices. Accordingly, packaging for such ICs is also subject to ongoing shrinkage of form factors.

Some ICs such as processors, controllers, logic devices, memory devices and the like may be housed in a package including a substrate having internal electrical connections and other components. The package includes electrical connections to enable the package to be electrically connected to, for example, a socket that may be adapted on a circuit board such as a motherboard or the like.

One such packaging technology is known as a land grid array (LGA). A LGA package is a flip-chip (FC) package that includes one or more semiconductor die that are adapted within the socket, e.g., mounted on a substrate land carrier. An external surface of the substrate of the package includes a plurality of electrical contacts which are to mate with corresponding contacts in a LGA-type socket, while the other side of the package may be used as a mating surface for a thermal solution such as a heat sink.

As semiconductor devices shrink, so too do their packaging. While smaller size devices can be more efficiently and cheaply manufactured, size reductions in three dimensions can cause certain issues. For example, when a package shrinks in thickness, the package can become warped during various processing steps. Such warpage can affect the quality of electrical contact between the package and its intended mating surface within a system.

Furthermore, as devices include more and more functionality, additional electrical contacts are needed. To incorporate all the desired contacts, the size of the contacts, also referred to as land pads in a LGA implementation, decreases and the pitch or distance between pads also decreases. As these sizes and pitches decrease, so too do the corresponding contacts of a socket. In some implementations, these socket contacts are stamped metal contacts that may suffer from poor electrical connection, as the working range of these contacts becomes too small to compensate for warpage of a package post assembly. Such improper connection can lead to reduced performance or rejects if such connections fail to meet burn-in or other post-assembly tests.

DETAILED DESCRIPTION

In various embodiments, electrical contacts on a substrate of a semiconductor package may be made to be compliant. For example, in a LGA package, substrate landside pads may have compliance added to them. In this manner, improved electrical connection between the package and a corresponding socket may be effected. Accordingly, package warpage may be compensated for and finer pitches between electrical contacts in the socket (and corresponding pads of the package) may be afforded.

In different implementations, many different manners of providing compliance to package contacts may be realized. For example, in one embodiment an elastomer under the landside pads may be formed. In another implementation, micro-springs may be attached onto the pads, e.g., by a wire bonding operation. Still further, in some embodiments, air gaps may be formed under the landside pads to enable compliance. In yet other embodiments, compliant elements, which may be formed of a compliant material surrounded by a conductive material, may be used. These compliant elements may include differently shaped compliant portions or cores that are surrounded by a conductive layer, e.g., any one of a desired metal. In some implementations, these compliant elements may include multiple flat surfaces to enable their contact with the landside pad on the one side and with the socket contact on the other side. However, in other embodiments differently shaped compliant cores may be realized.

Figure 1A:
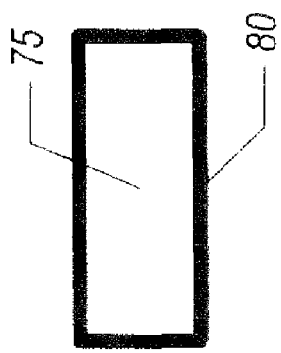
FIG. 1A is a cross-sectional view of a compliant element in accordance with one embodiment of the present invention.

Referring now to FIG. 1A, shown is a cross-sectional view of a compliant element in accordance with one embodiment of the present invention. As shown in FIG. 1A, a compliant element may be formed of a compliant core 75 that is encapsulated by a conductive layer 80. In some implementations, compliant core 75 may be a polymer material and conductive layer 80 may be any desired metal, such as titanium (TO/nickel (Ni)/gold (Au) or an alloy thereof. In other implementations, a copper (Cu)-based conductive layer may be formed.

Figure 1B:
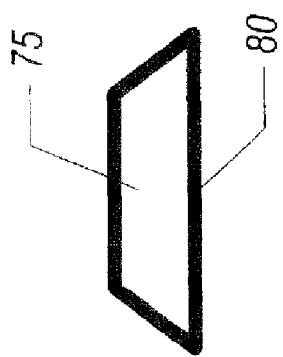
FIG. 1B is a cross-sectional view of a compliant element in accordance with another embodiment of the present invention.
Figure 1C:
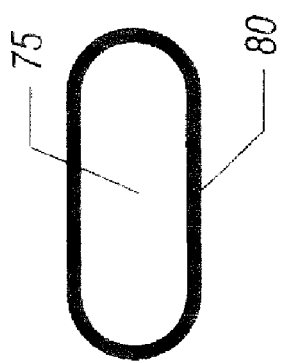
FIG. 1C is a cross-sectional view of an oval-shaped compliant element in accordance with another embodiment of the present invention.

Referring now to FIG. 1B, shown is another implementation of a compliant element in accordance with an embodiment of the present invention. As shown in FIG. 1B, the compliant element may be formed of a compliant core 75 and a surrounding conductive layer 80. In the implementation of FIG. 1B, the compliant element may be frustoconically-shaped. Of course, other implementations are also possible. For example, an oval-shaped core may be implemented as shown in FIG. 1C. As shown in FIG. 1C, the compliant element may be formed of a generally ovular compliant core 75 surrounded by a conductive layer 80. In some implementations, such compliant elements may be formed by molding a polymer core and then coating the core with a metal, e.g., via a sputtering operation. However, other manners of forming such compliant elements may be realized. To add such compliant elements to a pad, a solder layer, e.g., of a solder paste, may be formed on the pads and then the compliant element may be soldered onto the pads.

Of course in other embodiments, different manners of enabling compliance of landside pads may be realized. Furthermore, while primarily described herein with respect to a LGA type package and its landside pads, it is to be understood that the scope of the present invention is not so limited. That is, other embodiments may be used in ball grid array (BGA)-type packages or other known or future semiconductor packaging technologies. Furthermore, while discussed herein with reference to landside pads, it is to be understood that electrical contacts of any semiconductor packaging technology (referred to herein as pads or contacts) may be substituted for the landside pads described in the following embodiments.

Figure 2:
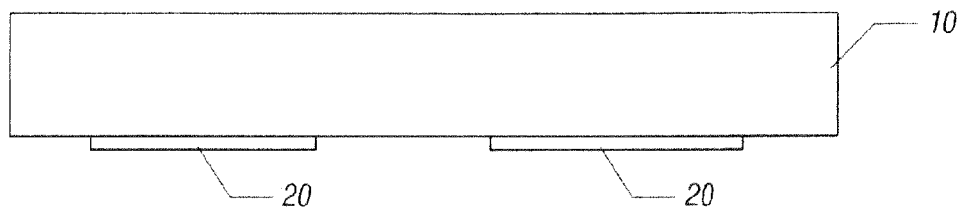
FIG. 2 is a cross-section of a partially formed semiconductor package in accordance with one embodiment of the present invention.

In some implementations, an elastomer under pad-type compliant solution may be implemented. Such a compliant pad may be particularly suited for use in various types of semiconductor packages. Referring now to FIG. 2, shown is a cross-section of a partially formed semiconductor package in accordance with one embodiment of the present invention. As shown in FIG. 2, package 5 includes a substrate 10 and multiple landside pads 20. While shown for ease of illustration in FIG. 2 as including only two such pads, it is to be understood that semiconductor packages may include hundreds and even thousands of such pads. Pads 20 may be formed of any type of metal that may be suitable for electrical contact including, for example, copper (Cu). In some implementations, pads 20 may be electroplated onto the land surface of substrate 10.

Figure 3:
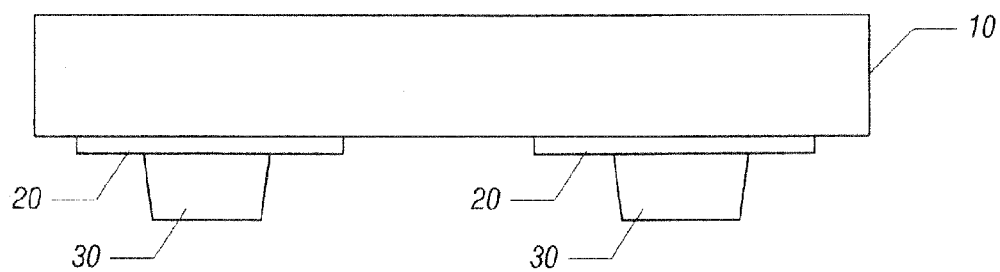
FIG. 3 is a cross-section of a next step in a fabrication process in accordance with an embodiment of the present invention.

Referring now to FIG. 3, shown is a cross-section of a next step in a fabrication process in accordance with an embodiment of the present invention. As shown in FIG. 3, compliant domes 30 may be formed on pads 20. In various embodiments, the compliant domes 30 may be formed of a relatively soft material, such as an elastomer, polymer or similar material. In one implementation, compliant domes 30 may be formed by coating a layer of a photo-definable elastomer material onto the landside of substrate 10. The material may then be photo-defined and patterned to form the desired size and shape of the domes. In some embodiments, a sacrificial material such as a thermally decomposable polymer may be coated on the landside of the substrate 10 prior to forming the layer of compliant material. In yet other implementations, such a decomposable material may be mixed with the compliant material. After formation of the compliant material layer in these embodiments, the substrate may be subjected to a heating process which decomposes the thermally decomposable material, allowing for an air gap, which may improve compliance. In other embodiments, the compliant material may be a silicone-based material, polyurethane-based material or the like.

While compliant domes 30 are shown as being of a substantially concentric formation with regard to pads 20, other implementations are possible. In some embodiments, compliant domes 30 may have an aspect ratio (i.e., height of dome 30 over diameter of pad 20) between approximately 0.05 and 0.5 with respect to pads 20 on which they are formed, however, the scope of the present invention is not limited in this regard. Furthermore, while described as being dome-shaped, it is to be understood that the compliant additions may be formed of different shapes, for example, cylindrical or other such shapes. Furthermore, as shown in FIG. 2, compliant domes 30 may be located on pads 20 such that a substantially annular exterior portion of pads 20 remains exposed.

Next, a layer of photoresist may be coated on the landside of substrate 10 and patterned to expose domes 30 and the exposed portions of pads 20. Then to enable electrical connections, a metal layer may be formed on these exposed portions. Specifically, in one embodiment a seed layer (e.g., of Cu) may be formed on these exposed surfaces, e.g., via sputtering. Then this seed layer may be built up, e.g., via an electroplating process to provide electrical contacts over domes 30 and in contact with pads 20 as shown in FIG. 4.

Figure 4:
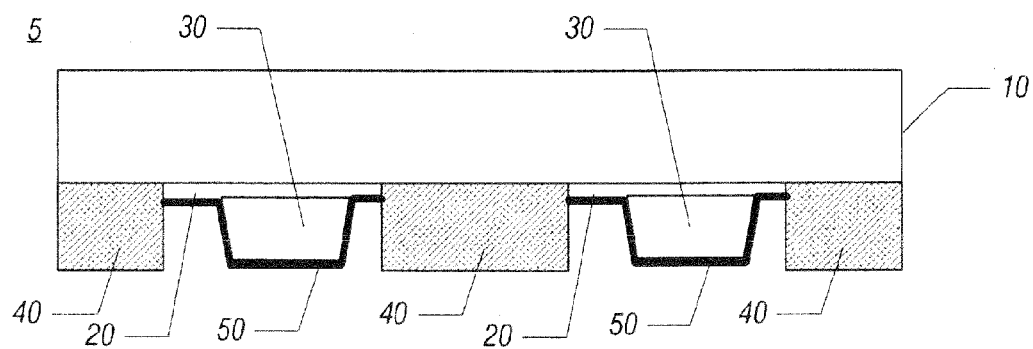
FIG. 4 is a cross-section of a next step in the fabrication process in accordance with an embodiment of the present invention.

Referring now to FIG. 4, shown is a cross-section of a next step in the fabrication process in accordance with an embodiment of the present invention. As shown in FIG. 4, a photoresist layer 40 blocks portions of the landside of substrate 10 which are not to be covered with a metal contact. Accordingly, as shown FIG. 4, photoresist layer 40 blocks landside portions of substrate 10 that do not include pads 20. The portions of the landside surface of substrate 10 including pads 20 are thus built up with a metal layer, e.g., an electroplated copper layer 50 as shown in FIG. 4.

Figure 5:
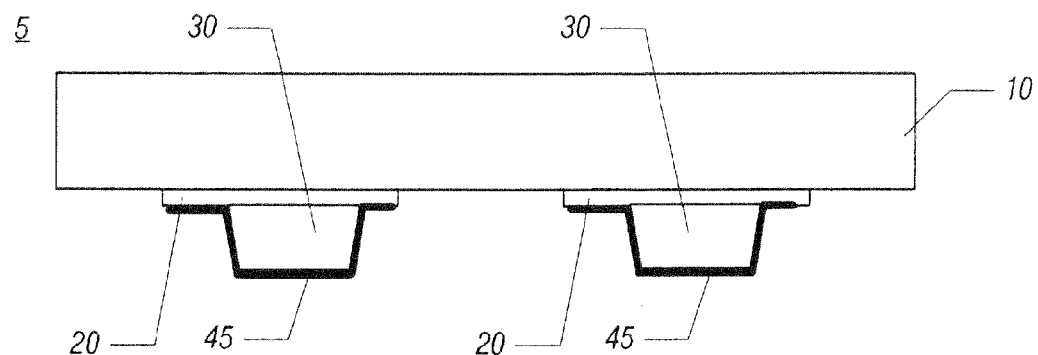
FIG. 5 is a cross-section of a next step in the fabrication process in accordance with an embodiment of the present invention.

Referring now to FIG. 5, shown is a cross-section of a next step in the fabrication process in accordance with an embodiment of the present invention. As shown in FIG. 5, photoresist layer 40 has been removed from the landside of substrate 10. Accordingly, a plurality of compliant pads 45 is achieved. These compliant pads may make improved contact with corresponding socket contacts, enabling finer pitches.

Figure 6:
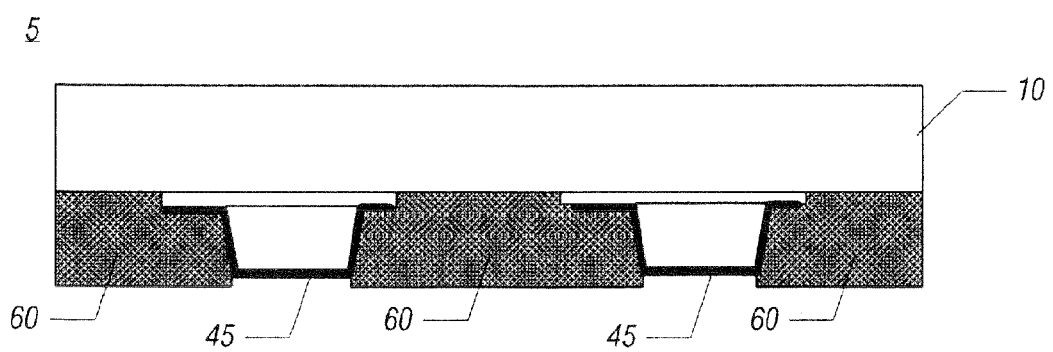
FIG. 6 is a cross-section of a next step in the fabrication process in accordance with an embodiment of the present invention.

Finally, a solder resist layer may be formed on the landside of substrate 10 to protect the substrate and enable joining of package 5 to a socket. As shown in FIG. 6, a solder resist layer 60 may be formed on the portions of the landside surface of substrate 10 that do not include compliant pads 45. In one embodiment, a photo-definable solder resist layer may be coated onto the backside of substrate 10. The layer may then be photo-defined and patterned to expose compliant pads 45. Accordingly, a substrate including compliant pads may be formed.

Further processing may be performed to obtain a completed semiconductor package. For example, one or more microelectronic die may then be mounted on substrate 10. Further, the die may be encapsulated with an underfill to redistribute the internal stress generated by the coefficient of thermal expansion (CTE) mismatch between the die and substrate 10, and then an integrated heat spreader (IHS) is attached on a backside of the die. Finally, package 5 may be adapted to a system, e.g., via a socket or via solder balls for a BGA-type connection or in another such manner. In a BGA package, the compliant pads may enhance reliability of a solder joint mechanically. While described with this particular fabrication process with respect to FIGS. 2-6, it is to be understood that the scope of the present invention is not so limited.

Figure 7:
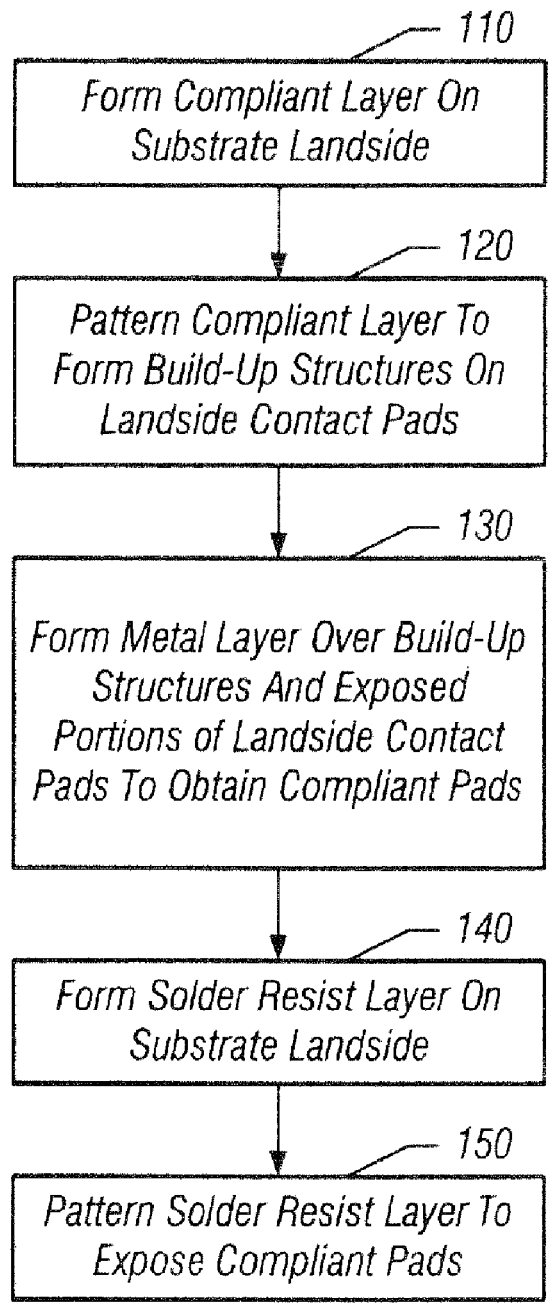
FIG. 7 is a flow diagram of a method of forming compliant pads in accordance with an embodiment of the present invention.

Referring now to FIG. 7, shown is a flow diagram of a method of forming compliant pads in accordance with an embodiment of the present invention. As shown in FIG. 7, method 100 may begin by forming a compliant layer on a substrate landside (block 110). For example, an elastomer layer may be coated on the landside. Next, the compliant layer may be patterned to form build-up structures on the contact pads of the landside (block 120). For example, the build-up structures may be domes or other shaped structures formed on at least portions of the contact pads.

Still referring to FIG. 7, a metal layer may be formed over the build-up structures and the exposed portions of the landside contact pads (block 130). In this way, compliant pads may be obtained. As described above, in some implementations first a photoresist layer may be applied and patterned to expose only the desired portions for metallization. Then, a seed layer of metal may be formed on the exposed portions, followed by an electroplating process to build up the metal layer. After stripping the remaining photoresist, a solder resist layer may be formed on the substrate landside (block 140). Then this solder resist layer may be patterned to expose the compliant pads (block 150). That is, at least a significant part of the top portions of the compliant pads may be exposed. In this way, improved electrical connection and finer pitch may be achieved in connecting a semiconductor package to a socket, for example. While described with these particular steps in the embodiment of FIG. 7, it is to be understood that the scope of the present invention is not so limited.

Figure 8:
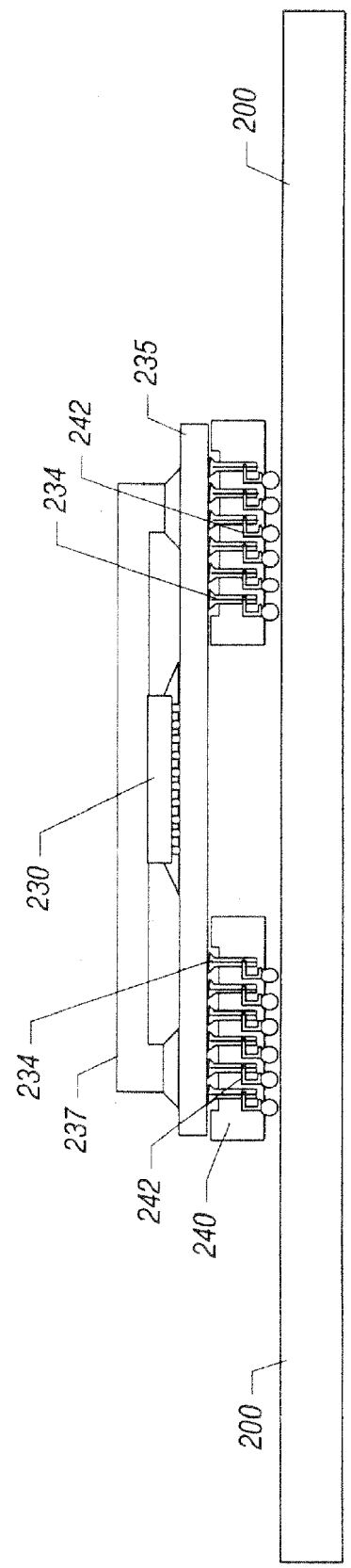
FIG. 8 is a cross-sectional view of a circuit board of a system in accordance with one embodiment of the present invention.

Referring now to FIG. 8, shown is a cross-sectional view of a circuit board of a system in accordance with one embodiment of the present invention. Circuit board 200 may support multiple components. For example, some components may be surface mounted onto the circuit board, while others may be mounted by use of conductive through-holes within the circuit board. Circuit board 200 may be any desired circuit board, such as a motherboard of a personal computer (PC).

As shown in FIG. 8, a primary side (i.e., the upper side) of circuit board 200 supports a semiconductor device 230, which may be coupled to circuit board 200 via a package 235. In one embodiment, semiconductor device 230 may be a microprocessor, such as a central processing unit (CPU) of the system. Package 235 may provide connections to bumps of semiconductor device 230. As an example, package 235 may be a LGA package. Alternately, package 235 may be a BGA package or another type of semiconductor package. The connections of package 235 may be compliant pads 234 formed in accordance with an embodiment of the present invention. While only two such pads are enumerated as such in FIG. 8, it is to be understood that a large amount of such compliant pads may be present in a given package.

As shown in FIG. 8, a socket 240 is connected to circuit board 200. Socket 240, which may be a LGA socket, includes a plurality of contacts 242 such as stamped metal contacts to mate with corresponding compliant pads 234 of package 235. During installation of semiconductor package 235 into socket 240, compliant pads 234 may be deformed to allow for proper electrical connection. Using embodiments of the present invention, warpage of package 235 may be compensated for and the pitch of contacts 242 and compliant pads 234 may be made finer.

An integrated heat spreader 237 may be mounted on package 235 (e.g., via a thermal interface material such as solder, and thermally conductive epoxy) and coupled to semiconductor device 230 to aid in cooling. In turn, a heat sink (not shown in FIG. 8) may be coupled to integrated heat spreader 237 to provide heat dissipation. While shown with these minimal components for ease of illustration the embodiment of FIG. 8, it is to be understood that circuit board 200 may include many additional components, including other semiconductor devices, discrete components, power supply connections and the like.

Figure 9:
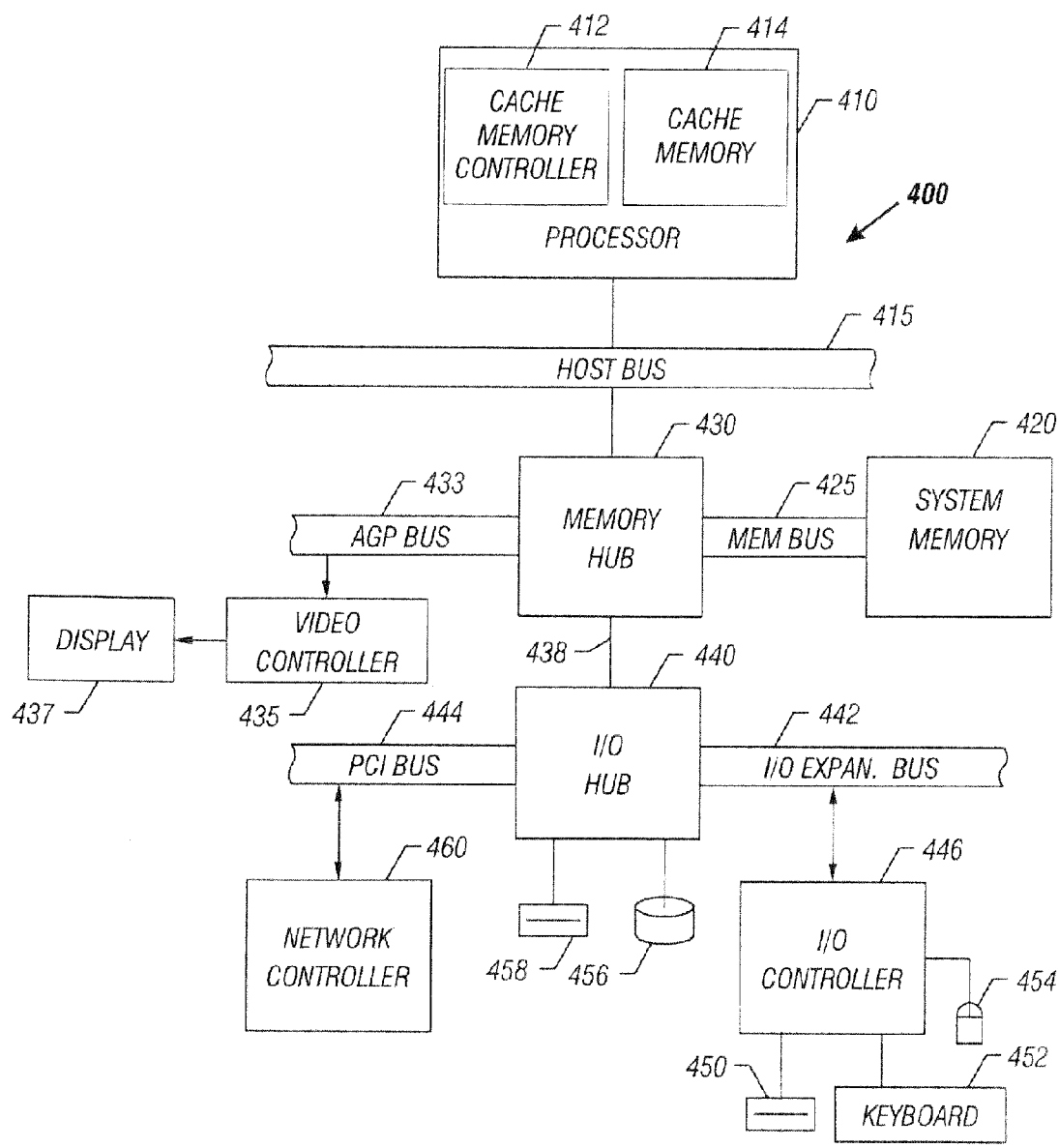
FIG. 9 is a block diagram of a computer system in which embodiments of the invention may be used.

Semiconductor packages in accordance with one embodiment may be used in various systems. FIG. 9 is a block diagram of a computer system 400 in which embodiments of the invention may be used. As used herein, the term "computer system" may refer to any type of processor-based system, such as a notebook computer, a server computer, a laptop computer, or the like.

Now referring to FIG. 9, in one embodiment, computer system 400 includes a processor 410, which may include a general-purpose or special-purpose processor such as a microprocessor, microcontroller, a programmable gate array (PGA), and the like. Processor 410 may include a cache memory controller 412 and a cache memory 414. Processor 410 may be housed in a package in accordance with an embodiment of the present invention and coupled via a socket to a circuit board of the system. Processor 410 may be coupled over a host bus 415 to a memory hub 430 in one embodiment, which may be coupled to a system memory 420 (e.g., a dynamic RAM) via a memory bus 425. Memory hub 430 may also be coupled over an Advanced Graphics Port (AGP) bus 433 to a video controller 435, which may be coupled to a display 437.

Memory hub 430 may also be coupled (via a hub link 438) to an input/output (I/O) hub 440 that is coupled to an input/output (I/O) expansion bus 442 and a Peripheral Component Interconnect (PCI) bus 444, as defined by the PCI Local Bus Specification, Production Version, Revision 2.1 dated June 1995. I/O expansion bus 442 may be coupled to an I/O controller 446 that controls access to one or more I/O devices. As shown in FIG. 9, these devices may include in one embodiment storage devices, such as a floppy disk drive 450 and input devices, such as a keyboard 452 and a mouse 454. I/O hub 440 may also be coupled to, for example, a hard disk drive 456 and a compact disc (CD) drive 458, as shown in FIG. 9. It is to be understood that other storage media may also be included in the system.

PCI bus 444 may also be coupled to various components including, for example, a network controller 460 that is coupled to a network port (not shown). Additional devices may be coupled to the I/O expansion bus 442 and the PCI bus 444. Although the description makes reference to specific components of system 400, it is contemplated that numerous modifications and variations of the described and illustrated embodiments may be possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A system comprising:
    a semiconductor package including a substrate to support at least one semiconductor die, the substrate including a first surface having a plurality of compliant conductive pads electrically coupled to the at least one semiconductor die;
    a socket including a plurality of contacts to mate with the plurality of compliant conductive pads of the semiconductor package; and
    wherein each of the plurality of compliant conductive pads comprises a multi-layer structure including a compliant layer sandwiched between a first conductive layer and a second conductive layer.

2. The system of claim 1, further comprising a circuit board including the socket, wherein the socket comprises a land grid array socket.

3. The system of claim 1, wherein the plurality of compliant conductive pads are deformable upon insertion of the semiconductor package into the socket.

4. The system of claim 1, wherein each of the plurality of compliant conductive pads comprises:
- a conductive pad formed on the first surface of the substrate; and
- a compliant element coupled to the conductive pad, including:
  - a compliant core; and
  - a conductive layer surrounding the compliant core.

5. A system comprising:
- a support structure for a semiconductor die provided on a first surface of said support structure; and
- a plurality of compliant conductive pads on a second surface of said support structure wherein said second surface is different from said first surface and each of the compliant conductive pads comprising:
  - a non-compliant conductive pad located on the support structure;
  - a compliant layer located directly on a portion of the non-compliant conductive pad;
  - a conductive layer located on the compliant layer and the non-compliant conductive pad; and
  - a socket including a plurality of contacts to mate with the plurality of compliant conductive pads.

6. The system of claim 5, wherein the compliant layer includes an air gap.

7. The system of claim 5, further comprising a socket coupled to the support structure.

8. The system of claim 5, wherein said support structure is used for a semiconductor package wherein the semiconductor package comprises a land grid array package.

9. A system comprising:
- a support structure have a first surface for a semiconductor die; and
- a plurality of compliant conductive pads on said structure, each of said pads including:
  - a non-compliant conductive pad located on a second surface of said support structure, wherein said second surface is different from said first surface; and
  - a compliant element directly affixed to the non-compliant conductive pad, the compliant element having a conductive exterior and a compliant interior.

10. The system of claim 9, wherein the compliant interior comprises a polymer core and the conductive exterior comprises a metal layer sputtered on the polymer core.

* * * * *